United States Patent [19]

Ronsisvalle

[11] Patent Number: 5,616,512
[45] Date of Patent: Apr. 1, 1997

[54] POWER SEMICONDUCTOR DEVICES

[75] Inventor: Cesare Ronsisvalle, Catania, Italy

[73] Assignee: Consorzio per la Ricerca sulla Microelettronica nel Mezzogiorno, Catania, Italy

[21] Appl. No.: 360,944

[22] Filed: Dec. 21, 1994

[30] Foreign Application Priority Data

Dec. 29, 1993 [EP] European Pat. Off. .............. 93830529

[51] Int. Cl.$^6$ ................................... H01L 21/76
[52] U.S. Cl. ................... 438/406; 148/DIG. 12; 148/DIG. 50; 438/459; 438/424; 438/355
[58] Field of Search ............................... 437/62, 63, 974, 437/67; 148/DIG. 12, DIG. 50

[56] References Cited

U.S. PATENT DOCUMENTS

| | | | |
|---|---|---|---|
| 3,434,019 | 3/1969 | Carley | 318/235 |
| 3,909,320 | 9/1975 | Gauge et al. | 148/187 |
| 4,001,860 | 1/1977 | Cauge et al. | 357/23 |
| 4,190,850 | 2/1980 | Tihanvi et al. | 357/23 |
| 4,233,615 | 11/1980 | Takemoto et al. | 357/22 |
| 4,305,974 | 12/1981 | Abe et al. | 427/89 |
| 4,549,193 | 10/1985 | Malhi et al. | 357/22 |
| 4,593,302 | 6/1986 | Lidow et al. | 357/23.4 |
| 4,682,405 | 7/1987 | Blanchard et al. | 29/571 |
| 4,766,090 | 8/1988 | Coquin et al. | 437/68 |
| 4,798,810 | 1/1989 | Blanchard et al. | 437/29 |
| 4,889,829 | 12/1989 | Shinichi | 437/69 |
| 4,908,328 | 3/1990 | Hu et al. | 148/DIG. 12 |
| 4,948,748 | 8/1990 | Kitahara et al. | 437/62 |
| 4,963,505 | 10/1990 | Fujii et al. | 437/62 |
| 4,985,745 | 1/1991 | Kitahara et al. | 437/62 |
| 5,036,021 | 7/1991 | Goto | 437/67 |
| 5,097,314 | 3/1992 | Nakagawa et al. | 437/62 |
| 5,223,450 | 6/1993 | Fujino et al. | 437/67 |
| 5,342,480 | 8/1994 | Nishizama et al. | 437/67 |
| 5,356,827 | 10/1994 | Ohoka | 437/974 |

FOREIGN PATENT DOCUMENTS 0543361  5/1993  European Pat. Off.  ........ H01L 21/76

OTHER PUBLICATIONS

Ohata et al; "Dielectrically Isolated Intelligent Power Switch" IEEE Custom Integrated Circuits Conference; 1987; pp. 443–446.

PESC 88 Record 19th Annual IEEE Power Electronics Specialists Conference Apr. 11–14, 1988, Tokyo, pp. 1325–1329, A. Nakagawa et al. "High Voltage, New Driver IC Technique Based on Silicon Wafer Direct–Bonding (SDB)".

Database WPI, Week 8926, Derwent Publications Ltd., London, GB; AN 89–189688 & JP–A–1129439 (Mitsubishi) Nov. 16, 1987.

Laid open patent specification no. 85073/80; Laid open date Jun. 26, 1980; Patent application no. 162677/75; Isao Yoshida "Methods of Manufacturing Insulated Gate Type Field Effect Transistors".

The Theory and Practice of Microelectronics; Chapters 4,6,7,8,10,13 and 15; Ghandi.

Primary Examiner—Trung Dang
Attorney, Agent, or Firm—David M. Driscoll; James H. Morris; John N. Anastasi

[57] ABSTRACT

A process for manufacturing integrated circuits includes the following steps. First, an oxide layer is formed on at least one surface of two respective semiconductor material wafers. Next, a single semiconductor material wafer is obtained with a first layer and a second layer of semiconductor material and a buried oxide layer interposed therebetween starting from said two semiconductor material wafers by direct bonding of the oxide layers previously grown. The single wafer is submitted to a controlled reduction of the thickness of the first layer of semiconductor material and the top surface of the first layer of semiconductor material is lapped. Dopant impurities are selectively introduced into selected regions of the first layer of semiconductor material to form the desired integrated components. Trenches are formed laterally delimiting respective portions of the first layer of semiconductor material wherein integrated components are present which are to be electrically isolated from other integrated components. Finally the walls of the trenches are coated with an insulating material and filled with amorphous silicon.

19 Claims, 3 Drawing Sheets

POWER SEMICONDUCTOR DEVICES

BACKGROUND OF THE INVENTION

1. Field of the Invention

The present invention relates to a process for manufacturing integrated circuits, particularly of intelligent power semiconductor devices.

2. Discussion of the Related Art

In manufacturing integrated circuits, the problem of obtaining chip regions which are electrically insulated from one another exists. For example, in power semiconductor devices provided with on-chip driving circuitry (also called intelligent power semiconductor devices), the power device must be electrically insulated from the driving circuitry.

The most common technique to achieve this electrical insulation is PN junction isolation. However, this technique gives rise to some problems, especially related to the introduction of parasitic components.

Considering for example a Vertical Intelligent Power semiconductor device (VIP), such as an NPN power bipolar transistor constituted by an N++ emitter region diffused into a P-type base region which is in turn diffused into an N-type epitaxial layer representing the collector of the transistor. The driving circuitry is obtained inside a P-type well which is diffused into the N-type epitaxial layer and connected to the lowest voltage among those utilized in the chip to keep the P-type well/N-type epitaxial layer junction reverse biased. Inside the P-type well, vertical NPN transistors and lateral PNP transistors are generally obtained. In this structure, a number of parasitic bipolar transistors are present, both NPN and PNP, having base, emitter and collector represented by the various P-type or N-type regions inside the P-type well, the P-type well itself and the N-type epitaxial layer. Another PNP parasitic transistor has emitter, base and collector respectively represented by the P-type base region of the power transistor, the N-type epitaxial layer and the P-type well. All such parasitic components limit VIP performances.

SUMMARY OF THE INVENTION

In view of the state of art described, the object of the present invention is to develop a process for manufacturing integrated circuits, particularly for intelligent power semiconductor devices which creates devices wherein the electrical insulation between various semiconductor regions does not give rise to parasitic components.

According to the present invention, this object is attained by means of a process for manufacturing integrated circuits which includes the following steps.

An oxide layer is formed on at least one surface of two respective semiconductor material wafers to obtain a single semiconductor material wafer with a first layer and a second layer of semiconductor material and a buried oxide layer interposed therebetween starting from said two semiconductor material wafers by direct bonding of the oxide layers previously grown. The single wafer is exposed to a controlled reduction of the thickness of the first layer of semiconductor material, and then the top surface of the first layer of semiconductor material is lapped. Next dopant impurities are selectively introduced into selected regions of the first layer of semiconductor material to form the desired integrated components. An insulating material layer is then formed over the top surface of the first layer of semiconductor material. The insulating material layer, and the first layer of semiconductor material are selectively etched down to the buried oxide layer to form trenches laterally delimiting respective portions of the first layer of semiconductor material wherein integrated components are present which are to be electrically isolated from other integrated components. Finally, the walls of the trenches are coated with an insulating material and the trenches are filled with amorphous silicon.

According to the present invention, it is possible to fabricate integrated circuits, particularly intelligent power semiconductor devices with an integrated driving circuitry, which are not affected by the presence of parasitic devices since the electrical isolation between the various devices is not accomplished by means of junction isolation, but by means of dielectric isolation.

If the integrated circuit to be fabricated is an intelligent power semiconductor device with an integrated driving circuitry, the process according to the invention comprises two additional steps.

The first semiconductor material layer is selectively etched down to the buried oxide layer to obtain selected portions of the single wafer wherein the buried oxide layer is uncovered, and dopant impurities are selectively introduced into selected regions of the second layer of semiconductor material to form the desired power device.

It is thus possible to fabricate intelligent power semiconductor devices with an integrated driving circuitry which are not affected by the presence of parasitic devices since the electrical isolation between the power devices and the driving circuitry and between the various components of the driving circuitry is not accomplished by means of junction isolation, but by means of dielectric isolation.

The features of the present invention will be made more evident by the following detailed description of its preferred embodiment, illustrated as a non-limiting example in the annexed drawings.

DETAILED DESCRIPTION

Figure 1:
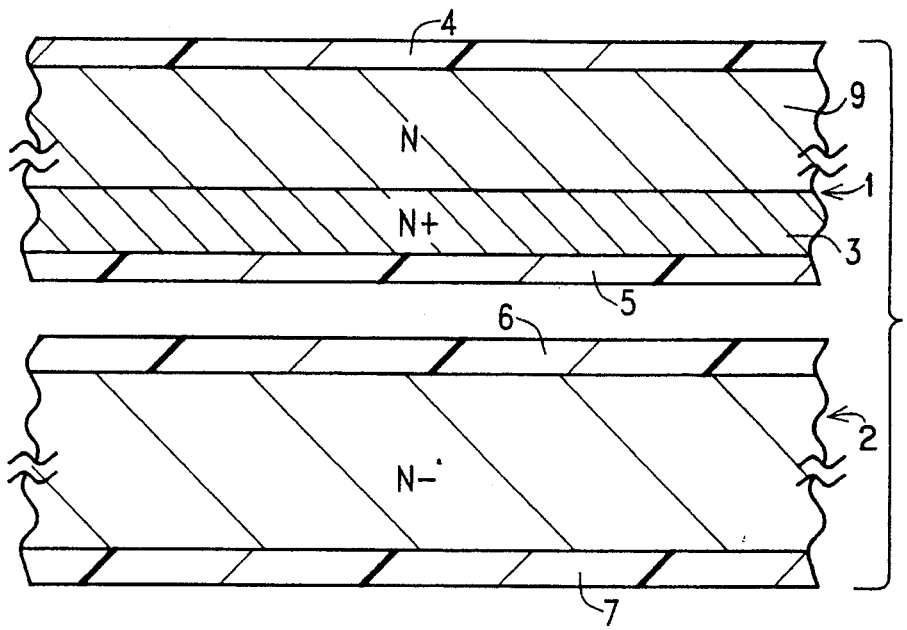
FIGS. 1 to 7 are cross-sectional views of a part of an integrated circuit taken at intermediate steps of a manufacturing process according to the preferred embodiment of the invention.

As shown in FIG. 1, a manufacturing process according to the invention starts from two distinct silicon wafers 1 and 2, generally doped with donor impurities. A first wafer 1 comprises an N-type semiconductor bulk 9 and an N+ heavily doped silicon layer 3 at its bottom surface. The second wafer 2 has resistivity and thickness values depending on the particular power device that is to be obtained.

The two silicon wafers 1 and 2 are then submitted to a thermal oxidation process to grow on the bottom surface of the first wafer 1 and on the top surface of the second wafer 2 respective thermal oxide layers 5 and 6. During this step, thermal oxide layers 4 and 7 are also grown on the top surface of the first wafer 1 and the bottom surface of the second wafer 2, respectively.

Figure 2:
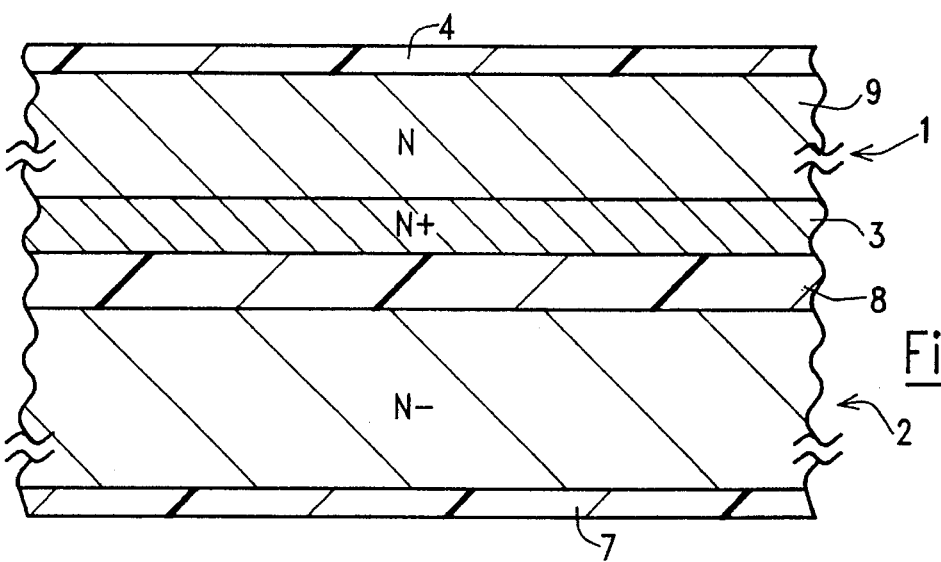

The two wafers 1 and 2 are then bonded together by means of the so-called "Silicon Direct Bonding" (SDB) technique, known per se and described for example in the European Patent Application No. 89202692.3. After this step, a single silicon wafer is obtained from the two silicon wafers 1 and 2. The bottom oxide layer 5 of the first wafer 1 and the top oxide layer 6 of the second wafer 2 constitute a single oxide layer 8 sandwiched between the second wafer 2 and the N+ layer 3 of the first wafer 1, and thus, this oxide layer is buried under the first wafer 1 (FIG. 2). Among the various Silicon On Insulator (SOI) techniques, the SDB technique produces buried oxide layers of better quality.

Figure 3:
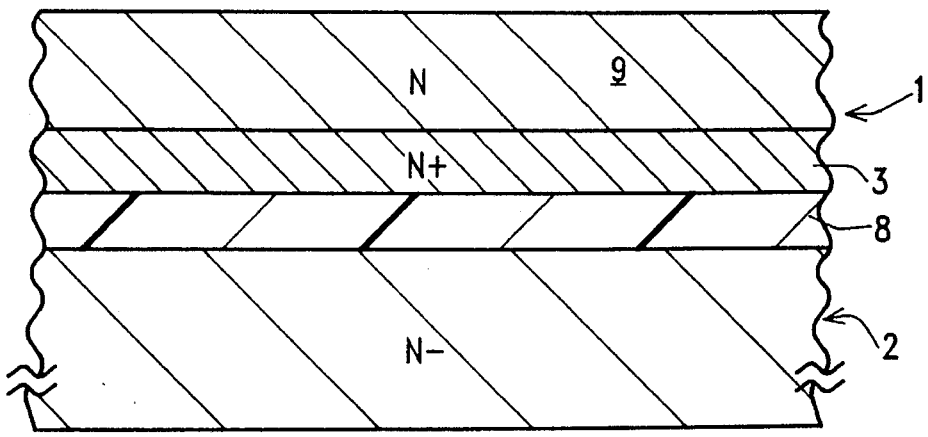

The top oxide layer 4 of the first wafer 1 and the bottom oxide layer 7 of the second wafer 2 are then removed, and the N-type semiconductor bulk 9 of the first wafer 1 is submitted to a controlled reduction of its thickness. The top surface of the N-type semiconductor bulk 9 of the first wafer 1 is then polished by means of a precision lapping and polishing machine (with a thickness tolerance of about 0.1 mm). The top surface of N-type semiconductor bulk 9 of the first wafer 1, at the end of these steps, represents the top side of the single silicon wafer composed by the two bonded silicon wafers 1 and 2 (FIG. 3).

Figure 4:
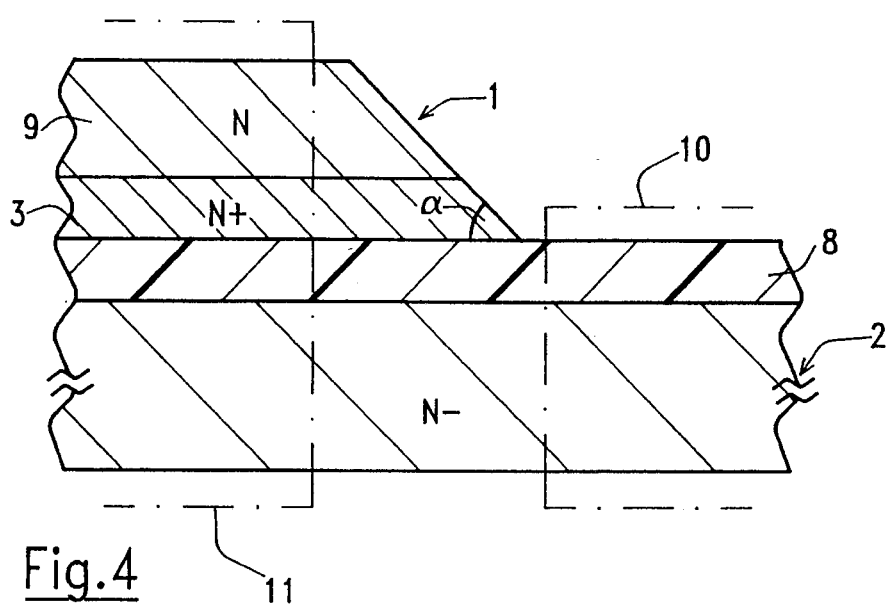

If the integrated device to be fabricated is a Vertical Intelligent Power (VIP) device, such as a bipolar power transistor, the N-type semiconductor bulk 9 and the N+ layer 3 of the first wafer 1 are selectively etched and removed down to the single oxide layer 8. At the end of this step, within all the regions 10 of the single silicon wafer wherein power devices are to be fabricated, the buried oxide layer 8 is uncovered. However, within all the regions 11 reserved to the driving circuitries for the power devices, the oxide layer 8 is still buried under the N-type semiconductor bulk 9 and the N+ layer 3 (FIG. 4). It is important to note that the etching angle a should be as small as possible, to avoid the creation of high steps so that the following depositions of the various layers (such as vapox, aluminum, nitride, etc.) is readily facilitated.

After this step, a thermal oxide layer is grown over the entire top surface of the wafer, i.e. over the top surface of the N-type silicon bulk 9 (in the wafer regions 11) and over the uncovered oxide layer 8 (in the wafer regions 10).

The power devices and their driving circuitries are fabricated in their respective wafer regions 10 and 11 according to a standard and per se known manufacturing process. It is to be noted that if the depth of field of the photolitographic apparatus employed in the manufacturing process is lower than the difference in height between the wafer regions 11 and 10, all the photolitographic steps in the wafer regions 10 reserved to the power devices are to be performed separately from those in the wafer regions 11 reserved to the driving circuitries.

Figure 5:
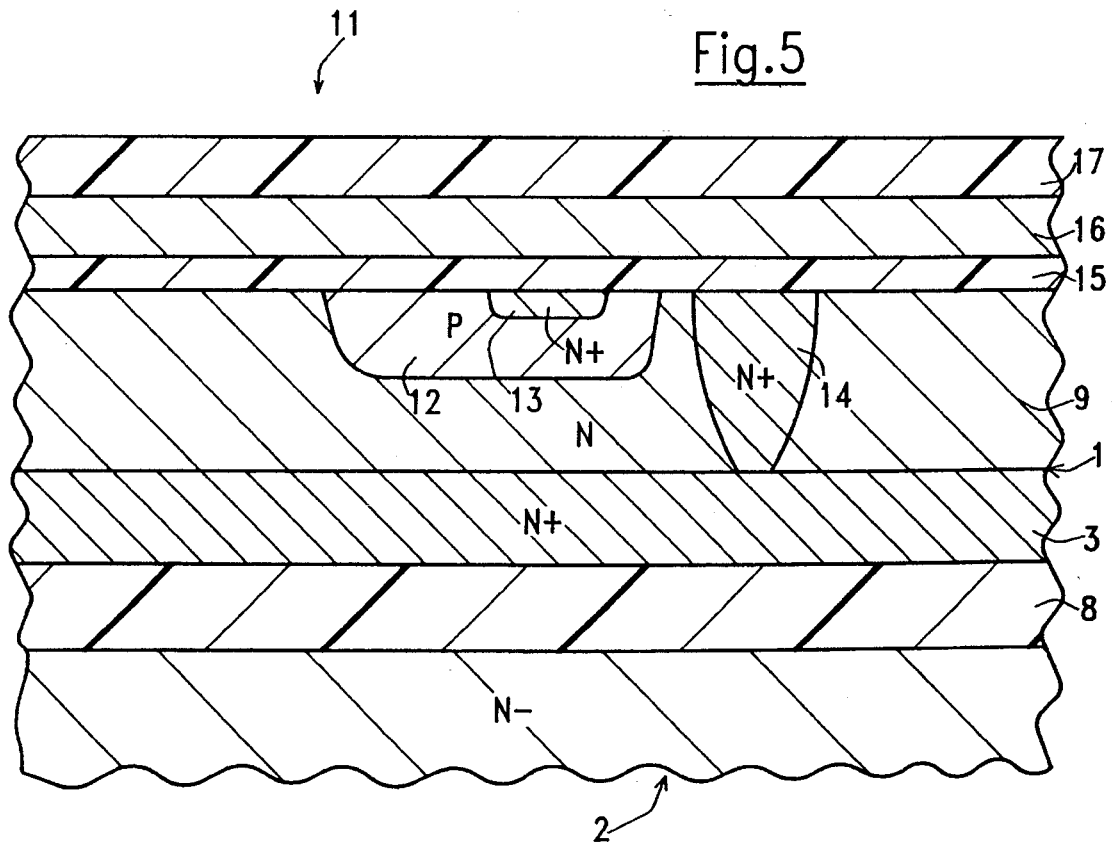

FIG. 5 shows on an enlarged scale a part of a wafer region 11 wherein a vertical NPN transistor is present. As known to anyone skilled in the art, the transistor comprises a P-type base region 12 diffused into the N-type semiconductor bulk 9, and an N+ emitter region 13 diffused into said base region 12. The collector region is represented by a portion of the N-type semiconductor bulk 9 which is located under the emitter region 13. When the transistor is biased in the forward active region, electrons are injected from the emitter region 13 into the base region 12 wherefrom they diffuse into the collector region. The N+ layer 3 represents a buried layer offering a low resistive path for the electrons to an N+ collector contact region 14.

Figure 6:
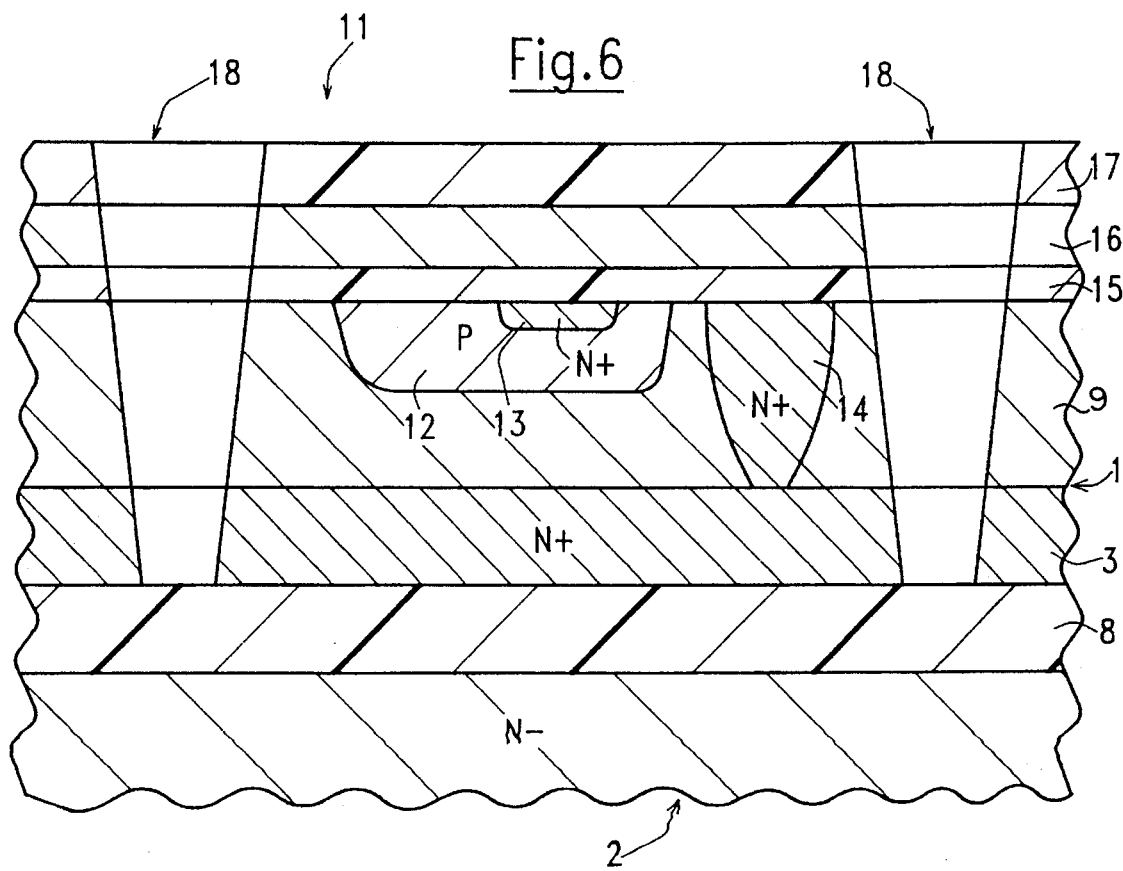

To electrically insulate the transistor shown in FIG. 5 from other integrated components defined in the same wafer region 11, the process according to the present invention provides for the realization of vertical trenches. To obtain said trenches, a per se known technique is used providing for the deposition over the top surface of the N-type silicon bulk 9 of an insulating material layer generally composed by three layers: a thin thermal oxide layer 15; a nitride layer 16 and a vapour-deposited oxide layer ("vpox") 17 (FIG. 5). Successively, the three layers 15, 16 and 17, together with the N-type semiconductor bulk 9 and the N+ layer 3, are selectively etched down to the buried oxide layer 8, to form a trench 18 around the lateral transistor shown as well as around all the other elements of the driving circuitry in the wafer region 11 which are to be electrically isolated from one another (FIG. 6). In certain embodiments, trench 18 may be substabtially v-shaped.

The trench 18 must then be filled with an insulation material. In one embodiment, the insulation materials consist only of an oxide. However, other materials may be used as well. For example, according to one technique, the walls of the trench 18 are first covered by an oxide layer 19, and the trench 18 is filled with amorphous silicon 20. In this way the wafer region 11 is divided into portions which are electrically insulated from one another laterally by means of the trench 18 and at the bottom by means of the buried oxide layer 8.

Figure 7:
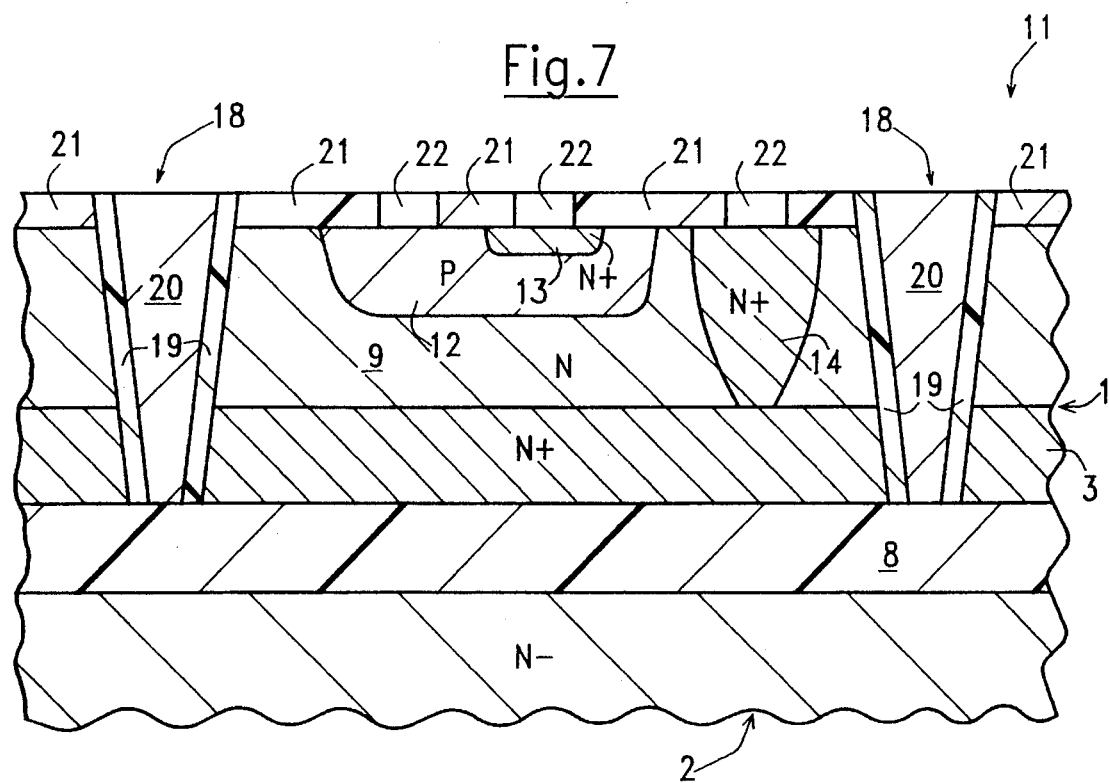

The top surface of the N-type silicon bulk 9 is then planarized, the three layers 15, 16 and 17 are removed from the surface of the N-type bulk 9, and a thermal oxide layer 21 is grown over the entire surface. Said oxide layer 21 is then selectively etched to form contact areas 22 (FIG. 7), and an aluminum layer (not shown) is deposited over the thermal oxide layer 21 and selectively etched to form the desired pattern of interconnection lines between the various components.

The process according to the present invention is suitable for the manufacturing of integrated circuits in general and not only of VIP devices. If no power devices are to be fabricated, neither the step of selective removal of the N-type semiconductor bulk 9 and of the N+ layer 3, nor the subsequent thermal oxidation of the entire wafer surface, are performed. Apart from these differences, the process is totally similar to that already described.

Having thus described one particular embodiment of the invention, various alterations, modifications and improvements will readily occur to those skilled in the art. Such alterations, modifications and improvements are intended to be part of this disclosure and are intended to be within the spirit and scope of the invention. Accordingly, the foregoing description is by way of example only, and not intended as limiting. The invention is limited only as defined in the following claims and equivalents thereto.

What is claimed is:

1. A method of manufacturing integrated circuits, comprising the steps of:

forming an oxide layer on at least one surface of two respective semiconductor material wafers;

obtaining a single semiconductor material wafer with a first layer and a second layer of semiconductor material and a buried oxide layer interposed therebetween starting from the two semiconductor material wafers by direct bonding together the oxide layers;

submitting the single wafer to a controlled reduction of a thickness of the first layer of semiconductor material;

lapping a top surface of the first layer of semiconductor material;

selectively etching the first layer of semiconductor material down to the buried oxide layer to obtain selected portions of the single wafer wherein the buried oxide layer is uncovered;

selectively introducing first dopant impurities into selected regions of the second layer of semiconductor material without introducing the first dopant impurities into the first layer of semiconductor material;

selectively introducing second dopant impurities into selected regions of the first layer of semiconductor material to form integrated components;

forming an insulating material layer over the top surface of the first layer of semiconductor material;

selectively etching the insulating material layer and the first layer of semiconductor material down to the buried oxide layer to form trenches laterally delimiting respective portions of the first layer of semiconductor material such that each integrated component is electrically isolated;

coating the walls of the trenches with an insulating material; and filling the trenches with amorphous silicon.

2. A method of manufacturing integrated circuits according to claim 1, further comprising the steps of:

removing the insulating layer from the top surface of the first semiconductor materials;

planarizing the top surface of the first semiconductor material;

growing a thermal oxide layer over the top surface of the first semiconductor material;

selectively etching the thermal oxide layer to form contact areas;

depositing aluminum over a top surface of the thermal oxide layer and a top surface of the first semiconductor materials to form an aluminum layer; and selectively etching the aluminum layer to form a pattern of interconnection lines between the integrated components.

3. The method according to claim 2 wherein the trenches are v-shaped.

4. The method according to claim 2 wherein a base of the trenches extends to the buried oxide layer.

5. The method according to claim 2, further comprising a contact layer disposed above the doped semiconductor regions.

6. The method according to claim 5, further comprising an oxide layer disposed above the electrically isolated portions everywhere except for where there is a contact layer.

7. The method according to claim 6 wherein a top surface of the contact layer and a top surface of the oxide layer are flat.

8. A method of isolating an integrated circuit, comprising the steps of:

providing a layer of semiconductor material having a first portion and a second portion;

disposing an integrated circuit within the first portion of the layer of the semiconductor material without etching an insulating material layer disposed along an outer surface of the first portion of the semiconductor material;

disposing the insulating material layer along an outer surface of the first portion and the second portion of the layer of the semiconductor material to form a layer of insulating material;

simultaneously etching a notch in the layer of insulating material along the outer surface of the second portion and in the second portion of the layer of the semiconductor material; and depositing insulation material consisting only of an oxide in the notch.

9. The method according to claim 1, wherein the step of selectively etching the insulating material layer and the first layer of semiconductor material includes forming trenches having a v-shape.

10. The method according to claim 1, further comprising a step of forming a contact layer disposed above the selected regions of the first layer of semiconductor material.

11. The method according to claim 1, wherein the step of selectively introducing dopant impurities into selected regions of the first layer of semiconductor material includes using a photolithographic apparatus, and wherein the step of selectively introducing dopant impurities into selected regions of the second layer semiconductor material includes using the photolithographic apparatus.

12. The method according to claim 1, wherein the step of selectively etching the first layer of semiconductor material includes using a small etching angle to avoid creating high steps.

13. The method according to claim 2, wherein the step of selectively etching the first layer of semiconductor material includes using a small etching angle to avoid creating high steps.

14. The method according to claim 8, wherein the step of depositing insulation material includes forming a vertical trench.

15. The method according to claim 8, wherein the step of depositing insulation material includes forming a vertical trench having a v-shape.

16. The method according to claim 8, wherein the step of disposing an integrated circuit within the first portion of the layer of semiconductor material includes the steps of:

providing a single semiconductor material wafer having a first layer of semiconductor material, a second layer of semiconductor material and a buried oxide layer disposed therebetween; and selectively introducing dopant impurities into selected regions of the first layer of semiconductor material.

17. The method according to claim 16, further comprising the steps of:

selectively etching the first layer of semiconductor material down to the oxide layer to obtain selected portions of the single wafer wherein the oxide layer is uncovered; and selectively introducing dopant impurities into selected regions of the second layer of the semiconductor material.

18. The method according to claim 17, wherein the step of selectively etching the first layer of semiconductor material includes using a small etching angle to avoid creating high steps.

19. A method of manufacturing an integrated circuit, the method comprising the steps of:

providing a semiconductor material wafer having a first layer of semiconductor material, a second layer of semiconductor material and an oxide layer interposed therebetween;

selectively etching the first layer of semiconductor material to the oxide layer to uncover selected portions of the oxide layer;

introducing first dopant impurities into selected regions of the second layer of semiconductor material without introducing the first dopant impurities into the first layer of semiconductor material;

introducing second dopant impurities into selected regions of the first layer of semiconductor material;

forming an insulating material layer over an outer surface of the first layer of semiconductor material;

selectively etching the insulating material layer and the first layer of semiconductor material to the oxide layer to form trenches; and coating the walls of the trenches with an insulating material.

* * * * *